(12) United States Patent
Shappir et al.

(10) Patent No.: US 7,420,848 B2
(45) Date of Patent: Sep. 2, 2008

(54) METHOD, SYSTEM, AND CIRCUIT FOR OPERATING A NON-VOLATILE MEMORY ARRAY

(75) Inventors: Assaf Shappir, Kiryat Ono (IL); Dror Avni, Haifa (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 15 days.

(21) Appl. No.: 11/328,015

(22) Filed: Jan. 9, 2006

(65) Prior Publication Data

US 2006/0126396 A1    Jun. 15, 2006

Related U.S. Application Data

(63) Continuation of application No. 10/747,217, filed on Dec. 30, 2003, now Pat. No. 7,079,420, which is a continuation-in-part of application No. 10/211,248, filed on Aug. 5, 2002, now Pat. No. 6,700,818.

(60) Provisional application No. 60/352,549, filed on Jan. 31, 2002.

(51) Int. Cl.
*G11C 16/06* (2006.01)
*G11C 16/04* (2006.01)

(52) U.S. Cl. .................. 365/185.22; 365/185.28; 365/185.29

(58) Field of Classification Search ............. 365/185.22
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |

(Continued)

FOREIGN PATENT DOCUMENTS

EP    0 656 628    6/1995

(Continued)

OTHER PUBLICATIONS

U.S. Appl. No. 08/902,890, filed Jul. 30, 1997, Eitan.

(Continued)

*Primary Examiner*—Son L Mai
(74) *Attorney, Agent, or Firm*—EMPK & Shiloh, LLP

(57) ABSTRACT

A method and a system for operating bits of memory cells in a memory array, the method including applying a first operating pulse to a terminal of a first cell, the first operating pulse is intended to place the first cell into a predefined state; and applying a second operating pulse to a terminal of a second cell in the set, the second operating pulse is intended to place the second cell to the predefined state, and the pulse characteristics of the second operating pulse are a function of the response of the first cell to the first operating pulse.

9 Claims, 4 Drawing Sheets

U.S. PATENT DOCUMENTS

| | | | |
|---|---|---|---|
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A * | 10/1996 | Fazio et al. ............ 365/45 |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,784 A * | 5/1997 | Roohparvar ......... 365/185.22 |
| 5,627,790 A | 5/1997 | Golla et al. |
| 5,633,603 A | 5/1997 | Lee |

| | | | | | | |
|---|---|---|---|---|---|---|
| 5,636,288 A | 6/1997 | Bonneville et al. | | 5,930,195 A | 7/1999 | Komatsu et al. |
| 5,644,531 A | 7/1997 | Kuo et al. | | 5,933,366 A | 8/1999 | Yoshikawa |
| 5,654,568 A | 8/1997 | Nakao | | 5,933,367 A | 8/1999 | Matsuo et al. |
| 5,656,513 A | 8/1997 | Wang et al. | | 5,936,888 A | 8/1999 | Sugawara |
| 5,657,332 A | 8/1997 | Auclair et al. | | 5,940,332 A | 8/1999 | Artieri |
| 5,661,060 A | 8/1997 | Gill et al. | | 5,946,258 A | 8/1999 | Evertt et al. |
| 5,663,907 A | 9/1997 | Frayer et al. | | 5,946,558 A | 8/1999 | Hsu |
| 5,672,959 A | 9/1997 | Der | | 5,949,714 A | 9/1999 | Hemink et al. |
| 5,675,280 A | 10/1997 | Nomura | | 5,949,728 A | 9/1999 | Liu et al. |
| 5,677,867 A | 10/1997 | Hazani | | 5,963,412 A | 10/1999 | En |
| 5,677,869 A | 10/1997 | Fazio et al. | | 5,963,465 A | 10/1999 | Eitan |
| 5,683,925 A | 11/1997 | Irani et al. | | 5,966,603 A | 10/1999 | Eitan |
| 5,689,459 A | 11/1997 | Chang et al. | | 5,969,989 A | 10/1999 | Iwahashi |
| 5,694,356 A | 12/1997 | Wong et al. | | 5,969,993 A | 10/1999 | Takeshima |
| 5,696,929 A | 12/1997 | Hasbun et al. | | 5,973,373 A | 10/1999 | Krautschneider et al. |
| 5,708,608 A | 1/1998 | Park et al. | | 5,982,666 A | 11/1999 | Campardo |
| 5,712,814 A | 1/1998 | Fratin et al. | | 5,986,940 A | 11/1999 | Atsumi et al. |
| 5,712,815 A | 1/1998 | Bill et al. | | 5,990,526 A | 11/1999 | Bez et al. |
| 5,715,193 A | 2/1998 | Norman | | 5,991,202 A | 11/1999 | Derhacobian et al. |
| 5,717,581 A | 2/1998 | Canclini | | 5,999,444 A | 12/1999 | Fujiwara et al. |
| 5,717,632 A | 2/1998 | Richart et al. | | 5,999,494 A | 12/1999 | Holzrichter |
| 5,717,635 A | 2/1998 | Akatsu | | 6,000,006 A | 12/1999 | Bruce et al. |
| 5,726,946 A | 3/1998 | Yamagata et al. | | 6,005,423 A | 12/1999 | Schultz |
| 5,729,489 A * | 3/1998 | Fazio et al. ............ 365/185.03 | | 6,011,725 A | 1/2000 | Eitan |
| 5,748,534 A | 5/1998 | Dunlap et al. | | 6,018,186 A | 1/2000 | Hsu |
| 5,751,037 A | 5/1998 | Aozasa et al. | | 6,020,241 A | 2/2000 | You et al. |
| 5,751,637 A | 5/1998 | Chen et al. | | 6,028,324 A | 2/2000 | Su et al. |
| 5,754,475 A | 5/1998 | Bill et al. | | 6,030,871 A | 2/2000 | Eitan |
| 5,760,445 A | 6/1998 | Diaz | | 6,034,403 A | 3/2000 | Wu |
| 5,760,634 A | 6/1998 | Fu | | 6,034,896 A | 3/2000 | Ranaweera et al. |
| 5,768,192 A | 6/1998 | Eitan | | 6,037,627 A | 3/2000 | Kitamura et al. |
| 5,768,193 A | 6/1998 | Lee et al. | | 6,040,610 A | 3/2000 | Noguchi et al. |
| 5,771,197 A | 6/1998 | Kim | | 6,044,019 A | 3/2000 | Cernea et al. |
| 5,774,395 A | 6/1998 | Richart et al. | | 6,044,022 A | 3/2000 | Nachumovsky |
| 5,777,919 A | 7/1998 | Chi-Yung et al. | | 6,063,666 A | 5/2000 | Chang et al. |
| 5,781,476 A | 7/1998 | Seki et al. | | 6,064,226 A | 5/2000 | Earl |
| 5,781,478 A | 7/1998 | Takeuchi et al. | | 6,064,251 A | 5/2000 | Park |
| 5,784,314 A | 7/1998 | Sali et al. | | 6,064,591 A | 5/2000 | Takeuchi et al. |
| 5,787,036 A | 7/1998 | Okazawa | | 6,074,916 A | 6/2000 | Cappelletti |
| 5,793,079 A | 8/1998 | Georgescu et al. | | 6,075,402 A | 6/2000 | Ghilardelli |
| 5,801,076 A | 9/1998 | Ghneim et al. | | 6,075,724 A | 6/2000 | Li et al. |
| 5,805,500 A | 9/1998 | Campardo et al. | | 6,078,518 A | 6/2000 | Chevallier |
| 5,808,506 A | 9/1998 | Tran | | 6,081,456 A | 6/2000 | Dadashev |
| 5,812,449 A | 9/1998 | Song | | 6,084,794 A | 7/2000 | Lu et al. |
| 5,812,456 A | 9/1998 | Hull et al. | | 6,091,640 A | 7/2000 | Kawahara et al. |
| 5,812,457 A | 9/1998 | Arase | | 6,094,095 A | 7/2000 | Murray et al. |
| 5,815,435 A | 9/1998 | Van Tran | | 6,097,639 A | 8/2000 | Choi et al. |
| 5,822,256 A | 10/1998 | Bauer et al. | | 6,107,862 A | 8/2000 | Mukainakano et al. |
| 5,825,683 A | 10/1998 | Chang et al. | | 6,108,240 A | 8/2000 | Lavi et al. |
| 5,825,686 A | 10/1998 | Schmitt-Landsiedel et al. | | 6,108,241 A | 8/2000 | Chevallier |
| 5,828,601 A | 10/1998 | Hollmer et al. | | 6,117,714 A | 9/2000 | Beatty |
| 5,834,851 A | 11/1998 | Ikeda et al. | | 6,118,207 A | 9/2000 | Ormerod et al. |
| 5,835,935 A | 11/1998 | Estakhri et al. | | 6,118,692 A | 9/2000 | Banks |
| 5,836,772 A | 11/1998 | Chang et al. | | 6,122,198 A | 9/2000 | Haddad et al. |
| 5,841,700 A | 11/1998 | Chang | | 6,128,226 A | 10/2000 | Eitan et al. |
| 5,847,441 A | 12/1998 | Cutter et al. | | 6,128,227 A | 10/2000 | Kim |
| 5,861,771 A | 1/1999 | Matsuda et al. | | 6,130,572 A | 10/2000 | Ghilardelli et al. |
| 5,862,076 A | 1/1999 | Eitan | | 6,130,574 A | 10/2000 | Bloch et al. |
| 5,864,164 A | 1/1999 | Wen | | 6,133,095 A | 10/2000 | Eitan et al. |
| 5,867,429 A | 2/1999 | Chen et al. | | 6,134,156 A | 10/2000 | Eitan |
| 5,870,334 A | 2/1999 | Hemink et al. | | 6,137,718 A | 10/2000 | Reisinger |
| 5,870,335 A | 2/1999 | Khan et al. | | 6,147,904 A | 11/2000 | Liron |
| 5,875,128 A | 2/1999 | Ishizuka et al. | | 6,147,906 A * | 11/2000 | Bill et al. ............... 365/185.14 |
| 5,877,537 A | 3/1999 | Aoki | | 6,150,800 A | 11/2000 | Kinoshita et al. |
| 5,880,620 A | 3/1999 | Gitlin et al. | | 6,154,081 A | 11/2000 | Pakkala et al. |
| 5,886,927 A | 3/1999 | Takeuchi | | 6,156,149 A | 12/2000 | Cheung et al. |
| RE36,179 E | 4/1999 | Shimoda | | 6,157,242 A | 12/2000 | Fukui |
| 5,892,710 A | 4/1999 | Fazio et al. | | 6,157,570 A | 12/2000 | Nachumovsky |
| 5,903,031 A | 5/1999 | Yamada et al. | | 6,163,048 A | 12/2000 | Hirose et al. |
| 5,910,924 A | 6/1999 | Tanaka et al. | | 6,163,484 A | 12/2000 | Uekubo |
| 5,920,503 A | 7/1999 | Lee et al. | | 6,169,691 B1 | 1/2001 | Pasotti et al. |
| 5,920,507 A | 7/1999 | Takeuchi et al. | | 6,175,523 B1 | 1/2001 | Yang et al. |
| 5,926,409 A | 7/1999 | Engh et al. | | 6,181,597 B1 | 1/2001 | Nachumovsky |

| | | | | | |
|---|---|---|---|---|---|
| 6,181,605 B1 | 1/2001 | Hollmer et al. | 6,400,607 B1 | 6/2002 | Pasotti et al. |
| 6,185,143 B1 | 2/2001 | Perner et al. | 6,407,537 B2 | 6/2002 | Antheunis |
| 6,188,211 B1 | 2/2001 | Rincon-Mora et al. | 6,410,388 B1 | 6/2002 | Kluth et al. |
| 6,188,613 B1 * | 2/2001 | Manning ............... 365/185.33 | 6,417,081 B1 | 7/2002 | Thurgate |
| 6,190,966 B1 | 2/2001 | Ngo et al. | 6,418,506 B1 | 7/2002 | Pashley et al. |
| 6,192,445 B1 | 2/2001 | Rezvani | 6,426,898 B1 | 7/2002 | Mihnea et al. |
| 6,195,196 B1 | 2/2001 | Kimura et al. | 6,429,063 B1 | 8/2002 | Eitan |
| 6,198,342 B1 | 3/2001 | Kawai | 6,433,624 B1 | 8/2002 | Grossnikle et al. |
| 6,201,282 B1 | 3/2001 | Eitan | 6,436,766 B1 | 8/2002 | Rangarajan et al. |
| 6,201,737 B1 | 3/2001 | Hollmer et al. | 6,436,768 B1 | 8/2002 | Yang et al. |
| 6,205,055 B1 * | 3/2001 | Parker ................ 365/185.19 | 6,438,031 B1 | 8/2002 | Fastow |
| 6,205,056 B1 | 3/2001 | Pan et al. | 6,438,035 B2 | 8/2002 | Yamamoto et al. |
| 6,205,059 B1 | 3/2001 | Gutala et al. | 6,440,797 B1 | 8/2002 | Wu et al. |
| 6,208,200 B1 | 3/2001 | Arakawa | 6,442,074 B1 | 8/2002 | Hamilton et al. |
| 6,208,557 B1 | 3/2001 | Bergemont et al. | 6,445,030 B1 | 9/2002 | Wu et al. |
| 6,214,666 B1 | 4/2001 | Mehta | 6,449,188 B1 | 9/2002 | Fastow |
| 6,215,148 B1 | 4/2001 | Eitan | 6,449,190 B1 | 9/2002 | Bill |
| 6,215,697 B1 | 4/2001 | Lu et al. | 6,452,438 B1 | 9/2002 | Li |
| 6,215,702 B1 | 4/2001 | Derhacobian et al. | 6,456,528 B1 | 9/2002 | Chen |
| 6,218,695 B1 | 4/2001 | Nachumovsky | 6,456,533 B1 | 9/2002 | Hamilton et al. |
| 6,219,277 B1 | 4/2001 | Devin et al. | 6,458,656 B1 | 10/2002 | Park et al. |
| 6,219,290 B1 | 4/2001 | Chang et al. | 6,458,677 B1 | 10/2002 | Hopper et al. |
| 6,222,762 B1 | 4/2001 | Guterman et al. | 6,469,929 B1 | 10/2002 | Kushnarenko et al. |
| 6,222,768 B1 | 4/2001 | Hollmer et al. | 6,469,935 B2 | 10/2002 | Hayashi |
| 6,233,180 B1 | 5/2001 | Eitan et al. | 6,472,706 B2 | 10/2002 | Widdershoven et al. |
| 6,240,032 B1 | 5/2001 | Fukumoto | 6,477,085 B1 | 11/2002 | Kuo |
| 6,240,040 B1 | 5/2001 | Akaogi et al. | 6,490,204 B2 | 12/2002 | Bloom et al. |
| 6,246,555 B1 | 6/2001 | Tham | 6,496,414 B2 | 12/2002 | Kasa et al. |
| 6,252,442 B1 | 6/2001 | Malherbe | 6,504,756 B2 | 1/2003 | Gonzalez et al. |
| 6,252,799 B1 | 6/2001 | Liu et al. | 6,510,082 B1 | 1/2003 | Le et al. |
| 6,256,231 B1 | 7/2001 | Lavi et al. | 6,512,701 B1 | 1/2003 | Hamilton et al. |
| 6,261,904 B1 | 7/2001 | Pham et al. | 6,519,180 B2 | 2/2003 | Tran et al. |
| 6,265,268 B1 | 7/2001 | Halliyal et al. | 6,519,182 B1 | 2/2003 | Derhacobian et al. |
| 6,266,281 B1 | 7/2001 | Derhacobian et al. | 6,522,585 B2 | 2/2003 | Pasternak |
| 6,272,047 B1 | 8/2001 | Mihnea et al. | 6,525,969 B1 | 2/2003 | Kurihara et al. |
| 6,275,414 B1 | 8/2001 | Randolph et al. | 6,528,390 B2 | 3/2003 | Komori et al. |
| 6,281,545 B1 | 8/2001 | Liang et al. | 6,529,412 B1 | 3/2003 | Chen et al. |
| 6,282,133 B1 | 8/2001 | Nakagawa et al. | 6,532,173 B2 | 3/2003 | Lioka et al. |
| 6,282,145 B1 | 8/2001 | Tran et al. | 6,535,020 B1 | 3/2003 | Yin |
| 6,285,246 B1 | 9/2001 | Basu | 6,535,434 B2 | 3/2003 | Maayan et al. |
| 6,285,574 B1 | 9/2001 | Eitan | 6,537,881 B1 | 3/2003 | Rangarjan et al. |
| 6,285,589 B1 | 9/2001 | Kajitani | 6,538,270 B1 | 3/2003 | Randolph et al. |
| 6,285,614 B1 | 9/2001 | Mulatti et al. | 6,541,816 B2 | 4/2003 | Ramsbey et al. |
| 6,292,394 B1 | 9/2001 | Cohen et al. | 6,552,387 B1 | 4/2003 | Eitan |
| 6,297,096 B1 | 10/2001 | Boaz | 6,555,436 B2 | 4/2003 | Ramsbey et al. |
| 6,297,143 B1 | 10/2001 | Foote et al. | 6,559,500 B2 | 5/2003 | Torii |
| 6,297,974 B1 | 10/2001 | Ganesan et al. | 6,562,683 B1 | 5/2003 | Wang et al. |
| 6,304,485 B1 | 10/2001 | Harari et al. | 6,566,194 B1 | 5/2003 | Ramsbey et al. |
| 6,307,784 B1 | 10/2001 | Hamilton et al. | 6,566,699 B2 | 5/2003 | Eitan |
| 6,307,807 B1 | 10/2001 | Sakui et al. | 6,567,303 B1 | 5/2003 | Hamilton et al. |
| 6,308,485 B1 | 10/2001 | Harari et al. | 6,567,312 B1 | 5/2003 | Torii et al. |
| 6,320,786 B1 | 11/2001 | Chang et al. | 6,570,211 B1 | 5/2003 | He et al. |
| 6,324,094 B1 | 11/2001 | Chevallier | 6,574,139 B2 | 6/2003 | Kurihara |
| 6,326,265 B1 | 12/2001 | Liu et al. | 6,577,514 B2 | 6/2003 | Shor et al. |
| 6,330,192 B1 | 12/2001 | Ohba et al. | 6,577,532 B1 * | 6/2003 | Chevallier .............. 365/185.03 |
| 6,331,950 B1 | 12/2001 | Kuo et al. | 6,577,547 B2 | 6/2003 | Ukon |
| 6,335,874 B1 | 1/2002 | Eitan | 6,583,005 B2 | 6/2003 | Hashimoto et al. |
| 6,337,502 B1 | 1/2002 | Eitan et al. | 6,583,479 B1 | 6/2003 | Fastow et al. |
| 6,339,556 B1 | 1/2002 | Watanabe | 6,584,017 B2 | 6/2003 | Maayan et al. |
| 6,343,033 B1 | 1/2002 | Parker | 6,590,811 B1 | 7/2003 | Hamilton et al. |
| 6,346,442 B1 | 2/2002 | Aloni et al. | 6,593,606 B1 | 7/2003 | Randolph et al. |
| 6,348,381 B1 | 2/2002 | Jong | 6,594,181 B1 | 7/2003 | Yamada |
| 6,348,711 B1 | 2/2002 | Eitan | 6,608,526 B1 | 8/2003 | Sauer |
| 6,351,415 B1 | 2/2002 | Kushnarenko | 6,614,052 B1 | 9/2003 | Zhang |
| 6,353,356 B1 | 3/2002 | Liu | 6,614,295 B2 | 9/2003 | Tsuchi |
| 6,353,554 B1 | 3/2002 | Banks | 6,614,686 B1 | 9/2003 | Kawamura |
| 6,353,555 B1 | 3/2002 | Jeong | 6,614,692 B2 | 9/2003 | Maayan et al. |
| 6,356,469 B1 | 3/2002 | Roohparvar et al. | 6,617,179 B1 | 9/2003 | Kim |
| 6,359,501 B2 | 3/2002 | Lin et al. | 6,617,215 B1 | 9/2003 | Halliyal et al. |
| 6,374,337 B1 | 4/2002 | Estakhri | 6,618,290 B1 | 9/2003 | Wang et al. |
| 6,385,086 B1 | 5/2002 | Mihara et al. | 6,624,672 B2 | 9/2003 | Confaloneri et al. |
| 6,396,741 B1 | 5/2002 | Bloom et al. | 6,627,555 B2 | 9/2003 | Eitan et al. |
| 6,400,209 B1 | 6/2002 | Matsuyama et al. | 6,630,384 B1 | 10/2003 | Sun et al. |

| | | |
|---|---|---|
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 * | 11/2003 | Sofer et al. ............ 365/185.22 |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,829,172 B2 | 12/2004 | Bloom et al. |
| 6,831,872 B2 | 12/2004 | Matsuoka |
| 6,836,431 B2 | 12/2004 | Chang |
| 6,870,772 B1 * | 3/2005 | Nitta et al. ............ 365/185.22 |
| 6,871,258 B2 | 3/2005 | Micheloni et al. |
| 6,885,585 B2 | 4/2005 | Maayan et al. |
| 6,888,745 B2 * | 5/2005 | Ehiro et al. ................. 365/158 |
| 6,912,160 B2 | 6/2005 | Yamada |
| 6,917,544 B2 | 7/2005 | Maayan et al. |
| 6,928,001 B2 | 8/2005 | Avni et al. |
| 6,937,523 B2 | 8/2005 | Eshel |
| 6,967,872 B2 | 11/2005 | Quader et al. |
| 6,996,692 B2 | 2/2006 | Kuono |
| 7,079,420 B2 | 7/2006 | Shappir et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0012993 A1 | 1/2004 | Kurihara |
| 2004/0013000 A1 | 1/2004 | Torii |
| 2004/0014290 A1 | 1/2004 | Yang et al. |
| 2004/0021172 A1 | 2/2004 | Zheng et al. |
| 2004/0027858 A1 | 2/2004 | Takahashi et al. |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0058005 A1 | 3/2005 | Shappir et al. |
| 2005/0117395 A1 | 6/2005 | Maayan et al. |
| 2005/0140405 A1 | 6/2005 | Do et al. |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1225596 | 7/2002 |
| EP | 1227501 | 7/2002 |
| EP | 1333445 | 8/2003 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |

| | | |
|---|---|---|
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection Into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 521-524, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa et al., A 5-V-Only Operation 0.6-µm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, 24 vol.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, Ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd., 1110 pgs.

European Search Report No. EP06100056 dated Jul. 2, 2007.

* cited by examiner

METHOD, SYSTEM, AND CIRCUIT FOR OPERATING A NON-VOLATILE MEMORY ARRAY

CROSS-REFERENCE TO RELATED APPLICATIONS

The present application is a continuation from U.S. patent application Ser. No. 10/747,217, filed Dec. 30, 2003 which is a continuation-in-part application of U.S. Ser. No. 10/211,248, filed Aug. 5, 2002, issued as U.S. Pat. No. 6,700,818 on Mar. 2, 2004, which claims priority from U.S. provisional application Ser. No. 60/352,549, filed Jan. 31, 2002, both applications are hereby incorporated by reference in their entirety.

FIELD OF THE INVENTION

The present invention relates generally to operating memory cells of non-volatile memory (NVM) arrays, such as programming and erasing, and particularly to methods for reducing pulse operations of such arrays.

BACKGROUND OF THE INVENTION

Memory cells are used in the implementation of many types of electronic devices and integrated circuits, such as, but not limited to, erasable, programmable read only memories (EPROMs), electrically erasable, programmable read only memories (EEPROMs), and flash EEPROM memories. Memory cells are used to store the data and other information for these and other integrated circuits.

Non-volatile memory (NVM) cells generally comprise transistors with programmable threshold voltages. For example, a floating gate transistor or a split gate transistor has a threshold voltage (Vt) that is programmed or erased by charging or discharging a floating gate located between a control gate and a channel in the transistor. Data is written in such memory cells by charging or discharging the floating gates of the memory cells to achieve threshold voltages corresponding to the data.

The act of programming the cell involves charging the floating gate with electrons, which increases the threshold voltage Vt. The act of erasing the cell involves removing electrons from the floating gate, which decreases the threshold voltage Vt.

One type of non-volatile cell is a nitride, read only memory (NROM) cell, described in U.S. Pat. No. 6,011,725, the disclosure of which is incorporated herein by reference. Programming and erasing of NROM cells are also described in U.S. Pat. No. 6,011,725.

Unlike a floating gate cell, the NROM cell has two separated and separately chargeable areas. Each chargeable area defines one bit. The separately chargeable areas are found within a nitride layer formed in an oxide-nitride-oxide (ONO) stack underneath the gate. When programming a bit, channel hot electrons are injected into the nitride layer. This is generally accomplished by the application of a positive gate voltage and positive drain voltage, the magnitude and duration of which are determined by different factors related to the amount of programming required.

NROM cells may be single bit. Alternatively, they may have more than one bit, wherein two individual bits, a left-side bit and a right-side bit, are stored in physically different areas of the nitride layer. Each bit may be single level or multi-level ("MLC"), i.e., may be programmed to different voltage levels.

One procedure for programming bits in NROM cells with programming pulses is described in Applicant's copending U.S. patent application Ser. No. 09/730,586, entitled "Programming And Erasing Methods For An NROM Array", the disclosure of which is incorporated herein by reference.

The application of pulses to operate (program or erase) the NROM array may pose a problem for mass storage or code flash applications. For example, in programming a mass storage array, a major requirement is a fast programming rate, in the range of at least 2 MB/sec. The channel hot electron injection (CHE) used for programming may require a relatively high programming current, e.g., approximately 100 μA per cell. In addition, each programming step may comprise switching and subsequent verification steps. These factors may limit the amount of cells that may be programmed in parallel, to about 64 cells, for example.

Other complications that may hinder achieving fast, parallel programming rates include, among others, temperature dependence, cell length dependence (e.g., die to die and within a die), neighboring cell state dependence, second bit state dependence, and others. For example, FIG. 1 illustrates an effect of cell length on programming NROM cells. FIG. 1 illustrates the change in threshold voltage as a function of drain voltage used to program the cell. In the illustrated example, a first graph, denoted by the reference numeral 77, shows the change in threshold voltage as a function of drain voltage for a cell with a length of 0.5 microns. A second graph, denoted by the reference numeral 78, shows the change in threshold voltage as a function of drain voltage (Vd) for a cell with a length of 0.55 microns. It is seen that the slightly longer cell requires a higher drain voltage to achieve the same change in threshold voltage as the shorter cell.

As another example, FIG. 2 illustrates an effect of temperature on programming NROM cells. FIG. 2 illustrates the change in threshold voltage as a function of drain voltage (Vd) used to program the cell. In the illustrated example, a first graph, denoted by the reference numeral 79, shows the change in threshold voltage as a function of drain voltage in an ambient of 20° C. A second graph, denoted by the reference numeral 80, shows the change in threshold voltage as a function of drain voltage in an ambient of 85° C. It is seen that the warmer ambient requires a higher drain voltage to achieve the same change in threshold voltage as the cooler ambient.

Determination of programming pulses is also complicated by the fact that the cell parameters and operating conditions are usually initially unknown. Utilizing large programming pulse steps may reduce the total amount of programming pulses required to program the array. However, this may be disadvantageous because it may result in a wide and varied distribution of threshold voltages in the programmed cells of the array, which may reduce product reliability.

Alternatively, accurate verification of the cell threshold voltage and comparison of the threshold voltage to a variety of references may reduce the amount of programming pulses and provide faster convergence to the desired programmed threshold voltage level. However, such a method may incur a substantial overhead in the form of multiple verify pulses (e.g., one per reference), which is an undesirable time penalty, or may require an intricate parallel reference design, which is an undesirable chip area penalty.

SUMMARY OF THE INVENTION

The present invention seeks to provide methods for operating (programming or erasing) bits of memory cells in memory arrays, and for reducing pulse operations of such arrays. The invention is described in detail hereinbelow with reference to memory cells of NVM arrays, and particularly to multi-level NROM cells, wherein programming and erasing generally involve changing the threshold voltage level of a bit to a target threshold level. However, it should be emphasized that the invention is not limited to NVM arrays, nor to changing the threshold voltage levels of bits. Rather, the present invention is applicable for any non-volatile or volatile memory array whose operation is based on changing any kind of electrical, physical and/or mechanical properties of the cell array. The invention may be implemented in a variety of applications, such as but not limited to, mass storage or code flash applications, for example.

In accordance with an embodiment of the present invention, a set of cells in the array may be operated to determine their behavior characteristics upon the application of pulses to program or erase. After analyzing how the threshold voltage changes in accordance with the pulses, the rest of the array or some portion thereof may be programmed (or erased) en masse with a significantly reduced number of pulses and verifies. In some cases, the rest of the array may be programmed (or erased) with just one pulse. The additional operation pulses may be learnt and added to previous analysis and may determine the next operating pulse if more than one pulse is applied.

There is thus provided in accordance with an embodiment of the invention a method of operating a set of memory cells in a memory array, the method including applying a first operating pulse to a terminal of a first cell, the first operating pulse is intended to place the first cell into a predefined state, and applying a second operating pulse to a terminal of a second cell, the second operating pulse is intended to place the second cell to the predefined state, and the pulse characteristics of the second operating pulse are a function of the response of the first cell to the first operating pulse.

Further in accordance with an embodiment of the invention the method includes a step of applying a third operating pulse to a terminal of a third cell, the third operating pulse is intended to place the third cell to said predefined state, and the pulse characteristics of the third pulse are a function of the response of the first and the second cells to the first and the second operating pulses, respectively.

Further in accordance with an embodiment of the invention the method adjusts the pulse characteristics of the second operating pulse by adjusting the duration of the second operation pulse.

Still further in accordance with an embodiment of the invention the method adjusts the pulse characteristics of the second operation pulse by adjusting the amplitude of the second operation pulse.

In accordance with another embodiment of the invention a control circuit for operating a set of memory cells in a memory array is provided. The control circuit includes a charge circuit adapted to produce a first operating pulse to a terminal of a first cell intended to place the first cell into a predefined state, and a logic unit adapted to determine pulse characteristics of a second operating pulse as a function of the response of the first cell to the first operating pulse.

Further in accordance with an embodiment of the present invention the logic unit is adapted to determine pulse characteristics of a third operating pulse as a function of the response of the first cell and the second cell to the first and second operating pulses, respectively.

Further in accordance with an embodiment of the present invention the logic unit is adapted to adjust the duration of the second operation pulse.

Further in accordance with an embodiment of the present invention the logic unit is adapted to adjust the amplitude of said second operation pulse.

In accordance with an embodiment of the present invention the control circuit further includes a memory buffer adapted to store data received from the set of memory cells.

In accordance with another embodiment of the invention a system for operating a set of memory cells in a memory array is provided. The system includes a memory array, a sense amplifier adapted to determine a response of operated cells, and a control circuit adapted to produce a first operating pulse to a terminal of a first cell intended to place the first cell into a predefined state. The control circuit is further adapted to determine pulse characteristics of a second operating pulse as a function of the response of the first cell to the first operating pulse.

Further in accordance with an embodiment of the invention the control circuit is adapted to determine pulse characteristics of a third operating pulse as a function of the response of the first cell and the second cell to the first and second operating pulses, respectively.

Further in accordance with an embodiment of the invention the control circuit is adapted to adjust the duration of said the operation pulse.

Further in accordance with an embodiment of the invention the control circuit is adapted to adjust the amplitude of said second operation pulse.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
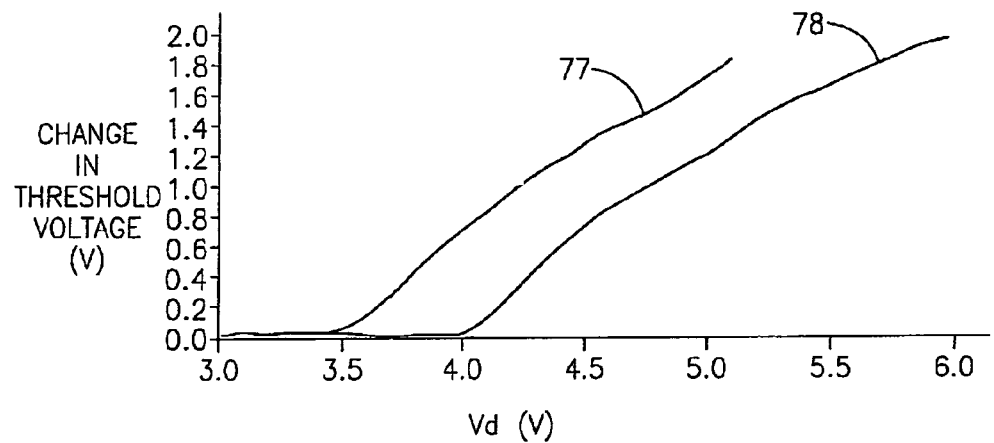
FIG. 1 is a simplified graph of an effect of cell length on programming speed for two different cell lengths.
Figure 2:
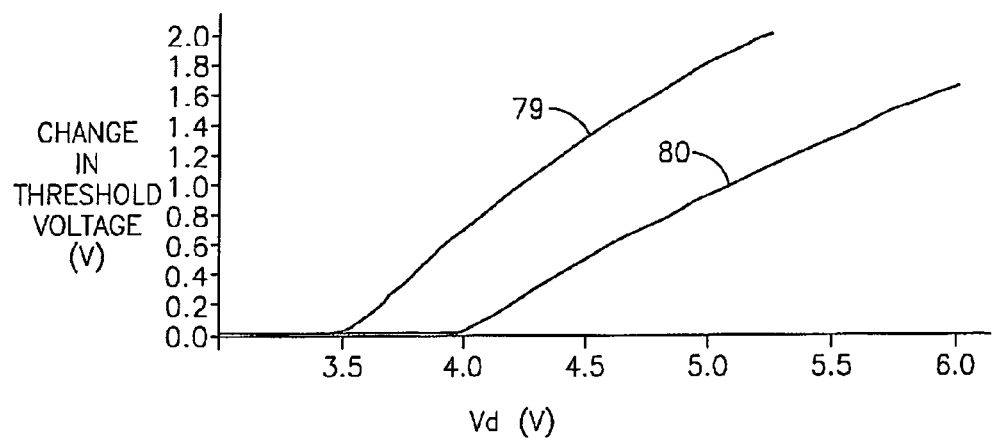
FIG. 2 is a simplified graph of an effect of temperature on programming speed for two different ambient temperatures.
Figure 3:
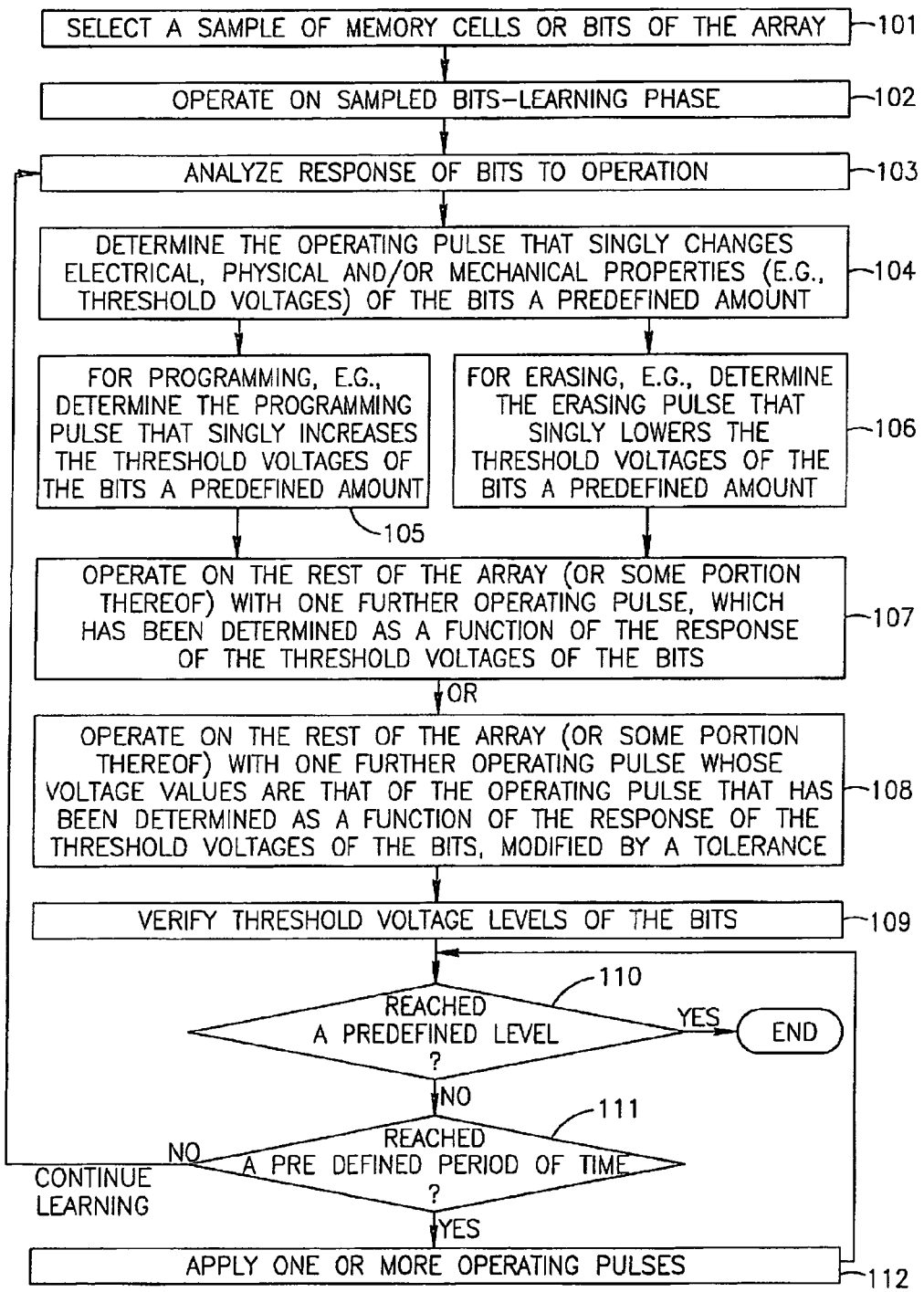
FIG. 3 is a flow chart of a method for operating (e.g., programming or erasing) bits of memory cells in a non-volatile memory cell array, in accordance with a preferred embodiment of the present invention.

Reference is now made to FIG. 3, which illustrates a method for operating bits of memory cells in a memory cell array, in accordance with an embodiment of the present invention. FIG. 3 is shown and described herein for programming the bits, but it is appreciated that the invention is not limited to the operation of programming, and the invention may be applied to other operations, such as but not limited to, erasing.

A set of memory cells or bits of the array may be selected (step 101). The set size may be any arbitrary size, such as but not limited to, 64 cells, for example. The bits in the set may then be programmed (step 102), such as by using a stepped programming algorithm. A suitable stepped programming algorithm is the one described in the Applicant's abovementioned copending U.S. patent application Ser. No. 09/730,586, entitled "Programming And Erasing Methods For An NROM Array". The method comprises applying progressive pulses or steps of programming voltages that progressively raise the threshold voltages of the bits to the desired programmed level. The number of programming pulses or steps may comprise any number, such as but not limited to, 8 steps, and may comprise different gate and drain voltages (source may be grounded), respectively applied to word lines and bit lines of the array. The voltages may be applied for different durations of time as well during the stepped algorithm. Another example for a programming algorithm is a programming algorithm for an MLC array. This programming algorithm is described in the Applicant's copending U.S. patent application Ser. No. 10/155,217, entitled "A Method Of Programming Nonvolatile Memory Cells". The method for programming an MLC having more than one programmed state to a target programmed state comprises applying a drain, a source and a gate voltage to the MLC, and verifying a threshold voltage level of the MLC. If the verified threshold voltage level of the MLC is below the threshold voltage level associated with the target programmed state, the drain voltage may be increased and the gate voltage may be maintained at a constant level during at least a part of the step of increasing. The steps of applying, verifying, increasing and maintaining may be repeated until the MLC's threshold voltage level is substantially equal to the threshold voltage level associated with the target programmed state. The number of said steps may also comprise any number. The application of the stepped programming algorithm or of the programming algorithm for the MLC array on the set of bits is referred to as the learning phase, wherein the response nature of the bits to the programming voltages may be learned and perhaps stored in memory. Preferably, the overall time allocated to the learning phase is negligible compared to the total array programming time, such as due to a small size of the set.

The response of the bits to the programming operation may then be analyzed, such as by a processor or a logic unit (step 103). The analysis may include information about the operation pulse including but not limited to, pulse height and length, resultant distribution tail, and amount of pulses, for example. The analysis may determine the one operating pulse that singly changes electrical, physical and/or mechanical properties of the bits a predefined amount (step 104). For example, in the programming operation, the processor may determine the programming pulse that singly increases the threshold voltages of the bits a predefined amount (step 105). In an erasing operation, the processor may determine an erasing pulse that singly lowers the threshold voltages of the bits a predefined amount (step 106).

Threshold voltage of non-volatile memory cells is just one example of electrical, physical and/or mechanical properties that may be analyzed in the learning phase. Another examples include piezoelectric and magnetoresistive properties of ferroelectric or ferromagnetic materials. For example, magnetic memory devices, such as magnetic random access memory devices, may include ferromagnetic layers separated by a non-magnetic layer. Information is stored as directions of magnetization vectors in magnetic layers. Magnetic vectors in one magnetic layer, for example, may be magnetically fixed or pinned, while the magnetization direction of the other magnetic layer may be free to switch between the same and opposite directions as information, referred to as "parallel" and "anti-parallel" states, respectively. In response to parallel and anti-parallel states, the magnetic memory device represents two different resistances. The resistance indicates minimum and maximum values when the magnetization vectors of two magnetic layers point in substantially the same and opposite directions, respectively. Accordingly, the change in the direction of the magnetization vectors or the change in the resistance are other examples of electrical, physical and/or mechanical properties that may be analyzed in the learning phase of the present invention.

The operating pulse, which has been determined as a function of the response of the electrical, physical and/or mechanical property (e.g., threshold voltage) of the bits, preferably incorporates the influence of effects or phenomena, such as but not limited to, ambient temperature, cell critical dimensions, array architecture, and others.

The rest of the array (or some portion thereof) may then be operated on (e.g., programmed or erased) with at least one further operating pulse whose voltage values are that of the operating pulse that has been determined in step 104 as a function of the response of the threshold voltages of the bits (step 107). Alternatively, the rest of the array (or some portion thereof) may then be operated on (e.g., programmed or erased) with at least one further operating pulse whose voltage values are that of the operating pulse that has been determined in step 104, modified by a tolerance (step 108). Utilization of this operating pulse (optionally, with or without some delta) as the starting point for operating (e.g., programming or erasing) on the rest of the array (or some portion thereof, may compensate for the varying effects mentioned above, such as but not limited to, ambient temperature, cell critical dimensions, array architecture, and others. Moreover, this operation pulse may be analyzed, such as by a processor. The analysis of this operation pulse may be added to previous analysis and may determine the one operating pulse that singly changes electrical, physical and/or mechanical properties of the bits a predefined amount. The additional analysis of the operation pulses on the set of bits is referred to as the continuous learning phase (steps 103-111). It is noted that the continuous learning phase may be used to achieve a better threshold distribution control.

After applying the further operating pulse, the threshold voltage levels of the bits may be verified (step 109) to determine if the threshold voltage levels have reached a predefined level (step 110). If the threshold voltage levels have reached the predefined level for programming or erase, the operation method ends. If the threshold voltage levels of a certain amount of bits have not yet reached the predefined level for programming or erase, then one or more operating pulses of the same value, or alternatively a different value, based on the continuous learning phase, may be applied to those bits or collectively to the bits of the array (step 111). The procedure may then continue until all of the bits (or a predetermined number of bits) have passed the verification step.

The additional operation pulse may be analyzed if it is done within a predefined period of time (step 112). The time criteria may be the ambient conditions within the array, such as the temperature and voltages, for example.

Figure 4:
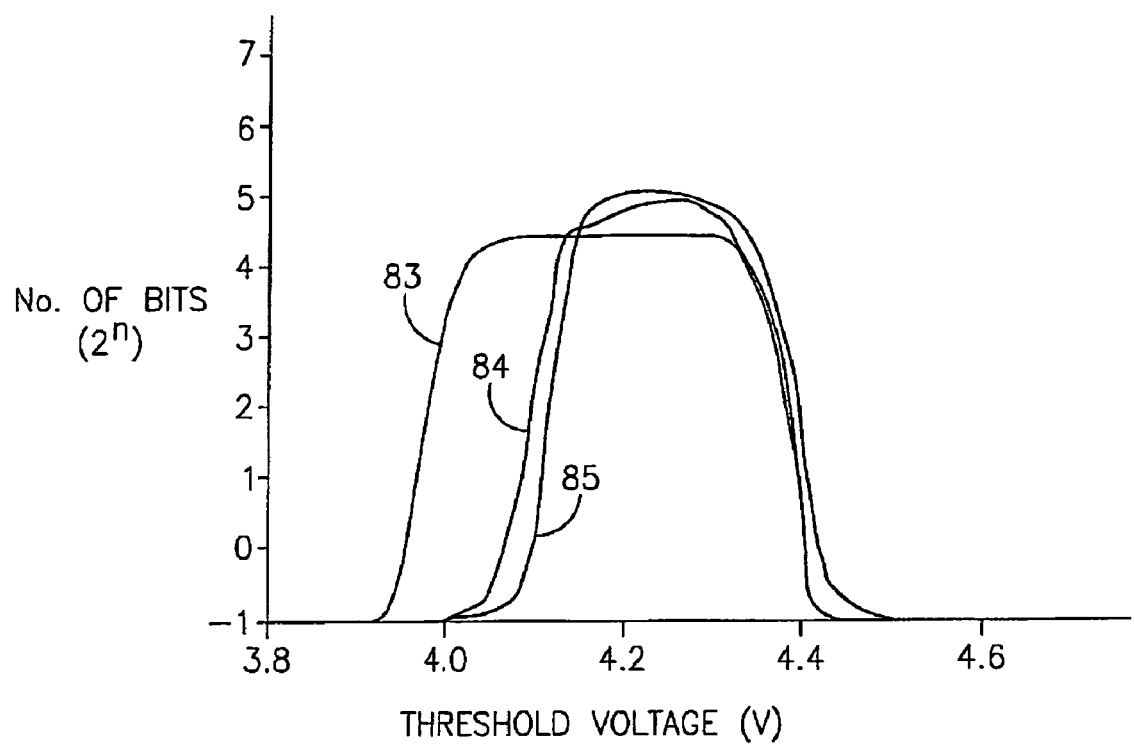
FIG. 4 is a simplified graph comparing the distribution of the threshold voltages of the cells of the entire array, respectively after the application of a single programming pulse, after a plurality of stepped programming pulses, and after a single programming pulse plus an additional supplementary programming pulse in accordance with a preferred embodiment of the present invention.

Reference is now made to FIG. 4, which illustrates a simplified graph comparing the distribution of the threshold voltages of the cells of the entire array after different applications of programming pulses, showing the number of bits (2n) versus the threshold voltage in volts. Curve 83 is the distribution of the threshold voltages of the cells of the entire array after application of a single programming pulse. The distribution is relatively wide. Curve 84 is the distribution of the threshold voltages of the cells of the entire array after a plurality of stepped programming pulses. The distribution is relatively narrow. Curve 85 is the distribution of the threshold voltages of the cells of the entire array after a single programming pulse (determined during the learning phase, as described hereinabove) plus an additional supplementary programming pulse, in accordance with an embodiment of the present invention. It is seen by comparing curves 84 and 85 that the final distributions of the threshold voltages are very similar. Thus, a stepped programming algorithm for the entire array may be replaced by a single programming pulse or a single pulse plus an additional pulse with virtually the same results, thereby significantly improving programming speed.

It will be appreciated by persons skilled in the art that the distribution of the threshold voltages of the cells of the entire array after a single programming pulse (determined during the continuous learning phase as described hereinabove) plus an additional supplementary programming pulse, in accordance with an embodiment of the present invention, may significantly further improve programming speed, because the operation pulse may be determined based on the analysis of a mounting set of operated cells. Since the continuous learning phase may be performed on a mounting set of operated cells, it may lead to a faster convergence to a desired programmed threshold voltage level.

It is noted that a method for operating bits of memory cells in a memory cell array, in accordance with an embodiment of the present invention, may begin with a preliminary step to determine the operation mode whether an array or a portion thereof will be operated with a learning phase, a continuous learning phase or without any of the above.

It is noted that the majority of the array cells may be fully programmed after the first programming pulse. Only a small distribution may require one higher programming pulse and a negligible amount of cells may require even higher pulses. It may be possible to achieve one pulse programming and obtain high writing speeds, with the method of the invention.

Figure 5:
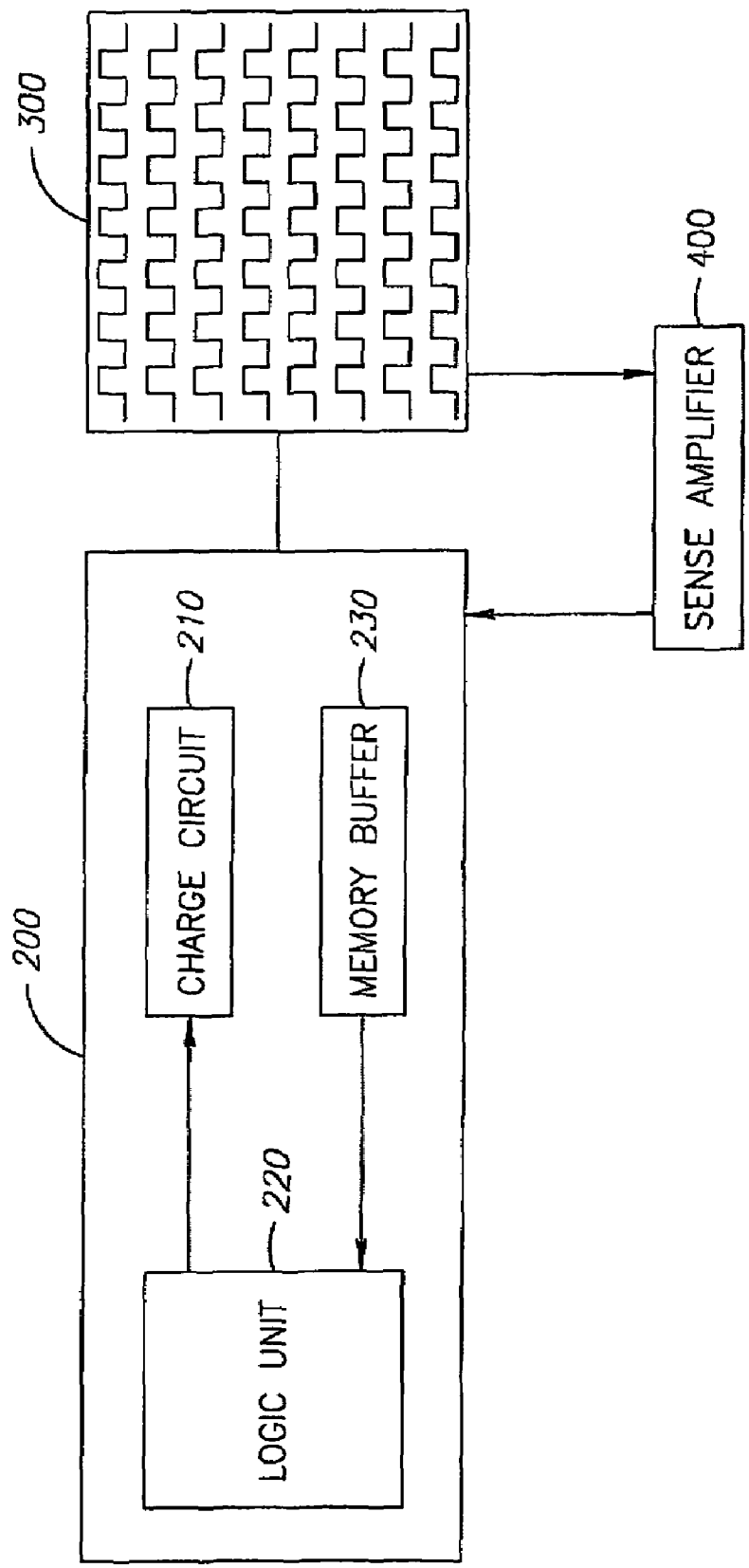
FIG. 5 is a block diagram of a control circuit, a memory array and a sense amplifier, in accordance with an embodiment of the present invention.

Reference is now made to FIG. 5, which illustrates a simplified block diagram of a Control Circuit 200, a Memory Array 300, and a Sense Amplifier 400, in accordance with an embodiment of the present invention. Control Circuit 200 may operate a set of memory cells in Memory Array 300. The set size may be any arbitrary size, such as but not limited to, 64 cells, for example. Control Circuit 200 may include a Charge Circuit 210 which may be adapted to produce a first operating pulse to a terminal of a first cell in Memory Array 200, and intended to place the first cell into a predefined state (i.e., programmed to a target state, read or erased). A Logic Unit 220 may be included in the Control Circuit 200 as well. Logic Unit 220 may be adapted to determine pulse characteristics of a second operating pulse as a function of the response of the first cell to the first operating pulse. Logic Unit 220 may be further adapted to determine pulse characteristics of a third operating pulse as a function of the response of the first cell and the second cell in Memory Array 300 to the first and second operating pulses, respectively. Control Circuit 200 may include an internal Memory Buffer 230 which may be adapted to store data received from Sense Amplifier 400, before it may be analyzed by Logic Unit 220. Sense Amplifier 400 may be adapted to determine the response of the bits to the operation pulses.

It is noted that the pulse characteristics of the operating pulses may be adjusted by adjusting the duration of the operation pulse or by adjusting the amplitude of the operating pulse. Logic Unit 220 may be adapted to adjust the pulse characteristics in both ways.

It will be appreciated by persons skilled in the art that the present invention is not limited by what has been particularly shown and described herein above. Rather the scope of the invention is defined by the claims that follow:

What is claimed is:

1. A control circuit for operating a set of memory cells in a memory array, said control circuit comprising: a charge circuit adapted to produce a first operating pulse to a terminal of a first cell intended to place the first cell into a predefined state; and a logic unit adapted to determine pulse characteristics of a second operating pulse as a function of the response of the first cell to the first operating pulse.

2. The control circuit according to claim 1, wherein said logic unit is further adapted to determine pulse characteristics of a third operating pulse as a function of the response of the first cell and a second cell to the first and second operating pulses, respectively.

3. The control circuit according to claim 1, wherein said logic unit is adapted to adjust the duration of said second operation pulse.

4. The control circuit according to claim 1, wherein said logic unit is adapted to adjust the amplitude of said second operation pulse.

5. The control circuit according to claim 1, further comprising a memory buffer adapted to store data received from the set of memory cells.

6. A system for operating a set of memory cells in a memory array, said system comprising: a memory array; a sense amplifier adapted to determine a response of operated cells; and a control circuit adapted to produce a first operating pulse to a terminal of a first cell intended to place the first cell into a predefined state; and adapted to determine pulse characteristics of a second operating pulse as a function of the response of the first cell to the first operating pulse.

7. The system according to claim 6, wherein said control circuit is further adapted to determine pulse characteristics of a third operating pulse as a function of the response of the first cell and a second cell to the first and second operating pulses, respectively.

8. The system according to claim 6, wherein said control circuit is adapted to adjust the duration of said second operation pulse.

9. The system according to claim 6, wherein said control circuit is adapted to adjust the amplitude of said second operation pulse.

* * * * *